(12) United States Patent  (10) Patent No.: US 8,874,391 B2
Taylor  (45) Date of Patent: Oct. 28, 2014

(54) DISTANCE-TO-FAULT MEASUREMENT SYSTEM CAPABLE OF MEASURING COMPLEX REFLECTION COEFFICIENTS

(75) Inventor: Matthew A. Taylor, Weare, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1106 days.

(21) Appl. No.: 12/478,822

(22) Filed: Jun. 5, 2009

(65) Prior Publication Data
US 2010/0312506 A1   Dec. 9, 2010

(51) Int. Cl.
| G01R 31/08 | (2006.01) |
| G06F 19/00 | (2011.01) |
| G01R 31/28 | (2006.01) |
| G01R 27/04 | (2006.01) |
| G01R 31/11 | (2006.01) |

(52) U.S. Cl.
CPC ............ *G01R 31/2822* (2013.01); *G01R 31/11* (2013.01); *G01R 27/04* (2013.01)
USPC ................ 702/59; 324/522; 702/85

(58) Field of Classification Search
USPC ......... 324/522, 533, 534, 601, 630, 638, 642, 324/646, 650, 76.21; 702/59, 85, 106, 118
See application file for complete search history.

(56) References Cited

U.S. PATENT DOCUMENTS

| 3,600,674 A | 8/1971 | Roberts et al. |
| 4,630,228 A | 12/1986 | Tarczy-Hornoch et al. |
| 4,777,429 A | 10/1988 | Potter |
| 4,808,912 A | 2/1989 | Potter et al. |
| 5,062,703 A | 11/1991 | Wong et al. |
| 5,068,614 A | 11/1991 | Fields et al. |
| 5,231,349 A * | 7/1993 | Majidi-Ahy et al. .... 324/754.06 |
| 5,272,439 A | 12/1993 | Mashikian et al. |
| 5,650,728 A | 7/1997 | Rhein et al. |
| 5,949,236 A | 9/1999 | Franchville |
| 5,994,905 A | 11/1999 | Franchville |
| 6,066,953 A | 5/2000 | Wadell |
| 6,075,628 A | 6/2000 | Fisher et al. |
| 6,614,237 B2 | 9/2003 | Ademian et al. |
| 6,636,048 B2 | 10/2003 | Sciacero et al. |
| 6,704,562 B1 * | 3/2004 | Oberschmidt et al. ........ 455/344 |
| 6,947,502 B2 | 9/2005 | Taylor et al. |

(Continued)

OTHER PUBLICATIONS

"Antenna/Transmission Line Installation and Maintenance. How to Control Costs and Maximize Reliability Using Frequency Domain Reflectometry"; 54100A Series Distance-To-Fault Application Note; Anritsu Wiltron.

(Continued)

*Primary Examiner* — Patrick Assouad
*Assistant Examiner* — Haidong Zhang
(74) *Attorney, Agent, or Firm* — Finch & Maloney PLLC

(57) ABSTRACT

Techniques are disclosed for computing distance-to-fault (DTF) in communication systems. The techniques can be embodied, for instance, in a DTF system that provides a multi-port probing device and DTF functionality, including computing distances to faults and the fault magnitudes. In addition, the DTF system is further configured with the ability to accurately measure complex reflection coefficient of the UUT, and/or return loss of the UUT. The complex reflection coefficient and/or return loss of the UUT can be computed as a function of known scattering parameters of a multi-port measurement circuit included in the probe of the DTF system.

23 Claims, 12 Drawing Sheets

(56) References Cited

U.S. PATENT DOCUMENTS

| | | |
|---|---|---|
| 7,061,221 B2 | 6/2006 | Niedzwiecki |
| 7,061,251 B2 | 6/2006 | Taylor et al. |
| 7,092,452 B2 | 8/2006 | Taylor et al. |
| 7,171,322 B2 | 1/2007 | Taylor |
| 7,254,511 B2 | 8/2007 | Niedzwiecki et al. |
| 7,269,223 B2 | 9/2007 | Learned et al. |
| 2004/0193382 A1* | 9/2004 | Adamian et al. .............. 702/118 |
| 2005/0156585 A1* | 7/2005 | Niedzwiecki .............. 324/76.21 |
| 2005/0195790 A1 | 9/2005 | Learned |
| 2005/0234662 A1* | 10/2005 | Niedzwiecki et al. .......... 702/60 |
| 2008/0018343 A1* | 1/2008 | Hayden ........................ 324/601 |
| 2009/0184721 A1* | 7/2009 | Albert-Lebrun et al. ..... 324/601 |

OTHER PUBLICATIONS

Bourke et al, "Intersection of Two Circles"; Apr. 1997.
PCT International Search Report dated Jul. 5, 2006 of International Application Na PCT/US05/01336 filed Jan. 13, 2005.
PCT International Search Report dated Mar. 29, 2006 of International Application No. PCT/US05/01799 filed Jan. 13, 2005.

\* cited by examiner

DISTANCE-TO-FAULT MEASUREMENT SYSTEM CAPABLE OF MEASURING COMPLEX REFLECTION COEFFICIENTS

RELATED APPLICATIONS

This application is related to U.S. Pat. Nos. 7,061,221, 7,061,251, 7,171,322, and U.S. Pat. No. 7,254,511, each of which is herein incorporated by reference in its entirety.

FIELD OF THE INVENTION

The invention relates to techniques for measuring complex reflection coefficients of single-port radio frequency (RF) and microwave devices, and more particularly, to techniques for improving distance-to-fault (DTF) measurement systems to accurately measure complex reflection coefficients of single-port devices.

BACKGROUND OF THE INVENTION

Distance-to-fault (DTF) generally refers to analyzing the performance of a communication medium, such as a transmission line or antenna. DTF typically employs time domain reflectometry (TDR) or frequency domain reflectometry (FDR), which allows for fault isolation in a transmission system by identifying the presence and location of signal path impairment (e.g., damaged transmission line or connector, loose connection, faulty component, etc). In short, such impairments can cause unwanted signal reflections, which in turn diminish the performance of the communication system. Thus, using DTF to identify impairments can improve system performance.

One effective way to characterize transmission systems, electrical networks, and other such linear networks is by scattering parameters (S-parameters), which can be obtained by measurements of a vector network analyzer. In this sense, a vector network analyzer can be used in carrying out DTF analysis. In particular, a vector network analyzer can be used to analyze magnitude and phase characteristics of transmission systems and electrical networks, which are characteristics associated with the reflection and transmission of electrical signals. A typical vector network analyzer can perform simultaneous transmission and reflection S-parameter measurements, complex impedance measurements, TDR and FDR measurements.

Unfortunately, vector network analyzers tend to be expensive and are generally bulky and heavy. There is a need, therefore, for cost effective and/or low bulk DTF techniques that allow for accurate measurement of complex reflection coefficients.

SUMMARY OF THE INVENTION

One embodiment of the present invention provides a method for computing a complex reflection coefficient of a unit under test (UUT) with a distance to fault (DTF) system having a probe that is operatively coupled to the UUT. The method includes performing probe alignment to produce measured alignment voltages, and adjusting calibration values based on the measured alignment voltages to produce adjusted calibration values. The method continues with measuring UUT voltages with the probe to produce measured UUT voltages, and computing a complex reflection coefficient of the UUT using the measured UUT voltages and the adjusted calibration values. The complex reflection coefficient is computed as a function of known scattering parameters of a multi-port measurement circuit included in the probe. The method may include the preliminary steps of displaying a graphical user interface (GUI) on a display viewable by a user, thereby allowing a user to select desired test parameters of the DTF system, and modifying test parameters of the DTF system based on the user selections. The method may include displaying the computed complex reflection coefficient (e.g., graphically over a range of frequencies, or as one or more discrete values at corresponding frequencies). In one particular case, the scattering parameters of the multi-port measurement circuit are mathematically represented as a 4 by 4 scattering matrix that takes into account detectors included in the probe. In one such case, the 4 by 4 scattering matrix completely specifies transfer functions of the probe's multi-port measurement circuit, and is used in mathematically representing the DTF system and UUT to be: an expanded multi-port measurement circuit (as a function of the complex reflection coefficients of the detectors included in the probe); an expanded source (as a function of an RF source attenuator setting); and an expanded UUT (as a function of switch paths and alignment standards). In one particular case, performing probe alignment to produce measured alignment voltages includes use of N alignment standards, such that for each alignment standard, voltages output by analog-to-digital (A/D) converters of the probe at each of M frequencies are recorded, and adjusting calibration values based on the measured alignment voltages to produce adjusted calibration values includes using the voltages output by the A/D converters to mathematically adjust alignment of the calibration values. In another particular case, performing probe alignment to produce measured alignment voltages includes use of three alignment standards, such that for each alignment standard, voltages output by analog-to-digital (A/D) converters of the probe at each of M frequencies are recorded. Here, the three alignment standards include an open circuit, a short circuit, and a 50 ohm broadband matched load. In another particular case, in computing the complex reflection coefficient of the UUT, detectors of the probe are modeled with a quadratic (polynomial order 2) equation and a sliding window (in frequency) is used to provide sufficient data to solve for quadratic coefficients required to model detector transfer function at each frequency of interest. In one such case, monotonicity is enforced on the detector transfer function. In another particular case, measuring UUT voltages with the probe to produce measured UUT voltages includes recording voltages output by analog-to-digital (A/D) converters of the probe at each of M frequencies, and computing the complex reflection coefficient of the UUT using the measured UUT voltages and the adjusted calibration values includes using the voltages output by the A/D converters. In another particular case, computing the complex reflection coefficient of the UUT using the measured UUT voltages and the adjusted calibration values involves solving equations that are in the form of two intersecting circles, such that points of intersection represent possible reflection coefficient estimates, and the complex reflection coefficient is computed using the reflection coefficient estimates.

Another embodiment of the present invention provides a computer readable medium encoded with instructions that, when executed by a processor, cause a process to be carried out for computing a complex reflection coefficient of a UUT with a DTF system having a probe that is operatively coupled to the UUT. The process may be configured similarly to, or a variation of, the previously described method for a computing complex reflection coefficient. Another embodiment of the present invention provides a DTF system for computing a complex reflection coefficient of a UUT, the system having a probe that can be operatively coupled to the UUT. The system may be configured, for example with a number of modules that can be executed or otherwise function to carry out functionality similar to, or a variation of, the previously described method for computing a complex reflection coefficient.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Techniques are disclosed for computing distance-to-fault (DTF) in communication systems. The techniques can be embodied, for instance, in a DTF system that provides a multi-port probing device and DTF functionality, including computing distances to faults and the fault magnitudes. In addition, the DTF system is further configured with the ability to accurately measure complex reflection coefficients of the UUT, and/or return loss of the UUT. As is known, the return loss of the UUT is easily computed from the complex reflection coefficient (i.e., Return loss=1−|reflection coefficient|).

General Overview

In order to allow the DTF system to accurately measure the complex reflection coefficient of the multi-port probing device, the system is programmed or otherwise configured to take into account various probe scattering parameters (s-parameters) that are ignored by conventional DTF systems. In particular, such conventional systems approximate these s-parameters as being of zero magnitude and accept the resulting inaccuracies in the estimated distances-to-faults. However, depending on the demands of the given application, measurements of complex reflection coefficients may require a higher level of accuracy in the probe scattering parameters, in order to obtain acceptable estimation accuracies. To this extent, and in accordance with one embodiment of the present invention, the DTF system is improved by eliminating the simplifying assumptions that certain scattering parameters in the 4-port measuring circuit are zero, which in turn provides enough additional accuracy to allow the DTF system to accurately measure complex reflection coefficients.

Figure 1A:
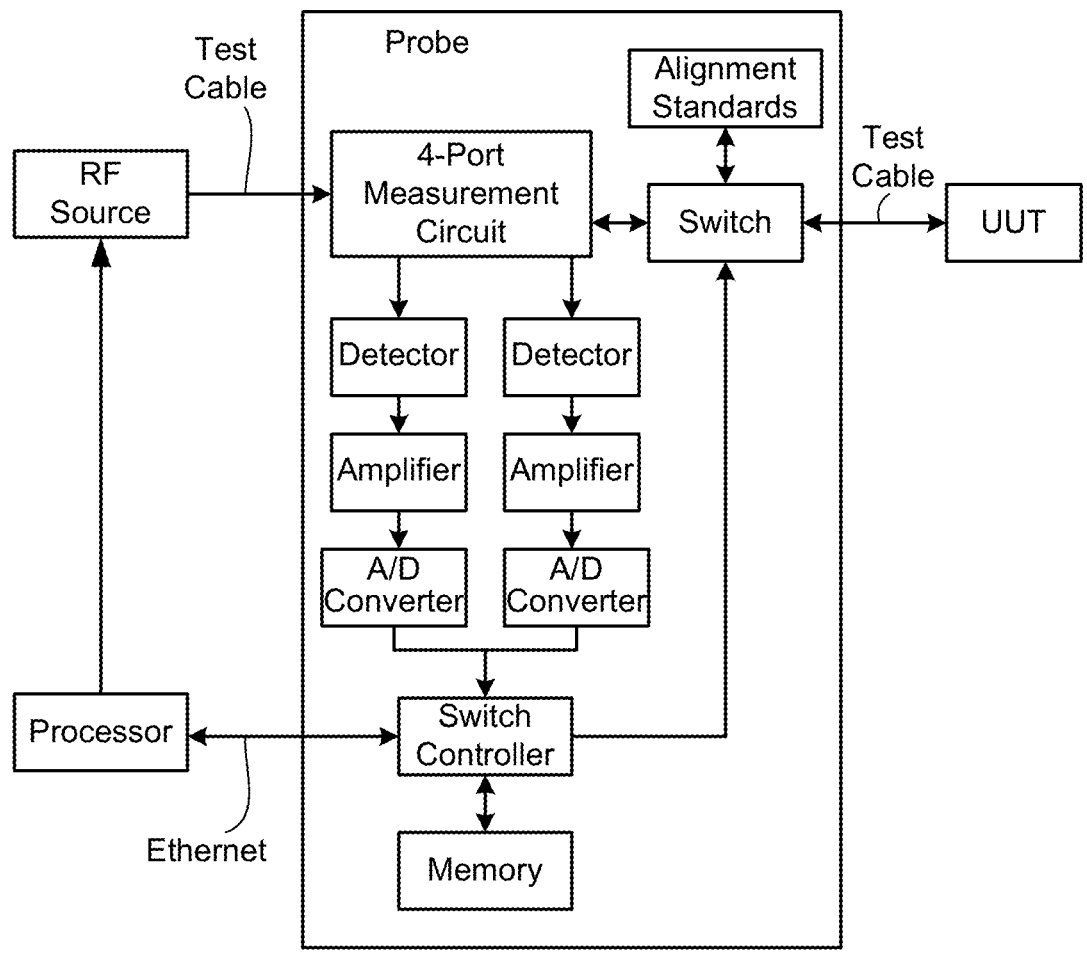
FIG. 1a illustrates a distance-to-fault (DTF) system configured to compute a complex reflection coefficient of a UUT, in accordance with an embodiment of the present invention.

Consider, for example, a test probe having a conventional 4-port measurement circuit for analyzing a target system (generally referred to herein as unit under test, or UUT) in various DTF applications. One example such DTF system having a 4-port measurement circuit operatively coupled to a UUT is shown in FIG. 1a. As can be seen, the four ports of the 4-port measurement circuit include the connection to an RF source (via a test cable), the connection to the UUT (via a switch and test cable), and the two connections to the two detectors. The output signals of the detectors, which can be implemented for example with diode or detector log video amplifier (DLVA) detectors, are provided to respective amplifiers, each of which has its output operatively coupled to an analog-to-digital (A/D) converter. The 4-port measurement circuit, detectors, amplifiers, and A/D converters can be implemented as conventionally done in probe applications (other conventional probe componentry not shown may also be included, as will be apparent in light of this disclosure). In addition, a switch operatively couples the 4-port measurement circuit to the UUT and a number of alignment standards that will be explained in turn. The switch itself can be implemented with conventional technology (e.g., RF switch with digital control), and is controlled by the switch controller, which is responsive to instructions from the processor. The processor, which is operatively coupled to the probe via an Ethernet connection in this example embodiment, is programmed or otherwise configured to execute DTF functionality as well as compute complex reflection coefficients in accordance with an embodiment of the present invention, as will be explained in turn. The processor can also be used to control or otherwise direct the RF source to provide the desired input signals to the probe. In some embodiments, the processor can be implemented with a computer (e.g., desktop, laptop, hand-held portable computer, personal digital assistant, smart phone, or other suitable computing device) configured with DTF and/or complex reflection coefficient computation modules and/or circuitry as described herein.

Alternatively, the processor can be implemented with a microcontroller having I/O capability and a number of executable routines encoded therein for carrying out DTF and/or complex reflection coefficient computation as described herein. Other suitable processing schemes will be apparent in light of this disclosure and can be used as well. With further reference to FIG. 1a, the memory coupled to the switch can be used to store, for example, measurement data output from the A/D converters and/or any calibration data associated with the probe. In such cases, the processor can access the memory (via the switch controller in this example configuration) and read the UUT measurement values and/or calibration data stored therein, execute a complex reflection coefficient (or return loss) computation based thereon, and cause the corresponding results to be displayed if so desired (e.g., via a display operatively coupled to the processor). The memory can be any suitable memory (e.g., RAM, flash, etc). Note, however, that the calibration data is typically stored in non-volatile memory, as it is data measured and placed in memory at the probe factory or repair shop. Numerous system variations will be apparent in light of this disclosure. For instance, the processor and/or RF source can be integrated directly into the probe if so desired (e.g., system-on-chip or chip set configurations). Likewise, the cabling and interconnects between the various components can be any suitable connecting media (e.g., coax, fiber, BNC, SMA, etc), given application particulars such as frequency range of operation, power levels, and desired degree of accuracy.

As will be explained with further reference to FIGS. 1b and 1c, a 4 by 4 matrix of scattering parameters can be used to completely specify the transfer functions of the 4-port measurement circuit of the probe shown in FIG. 1a. This complex scattering matrix can then be used to mathematically represent the DTF system and UUT of FIG. 1a to be: an expanded 4-port measurement circuit (as a function of the complex reflection coefficients of the detectors within the probe); an expanded source (as a function of the RF source attenuator setting); and an expanded UUT (as a function of the switch paths and alignment standards).

Figure 1B:
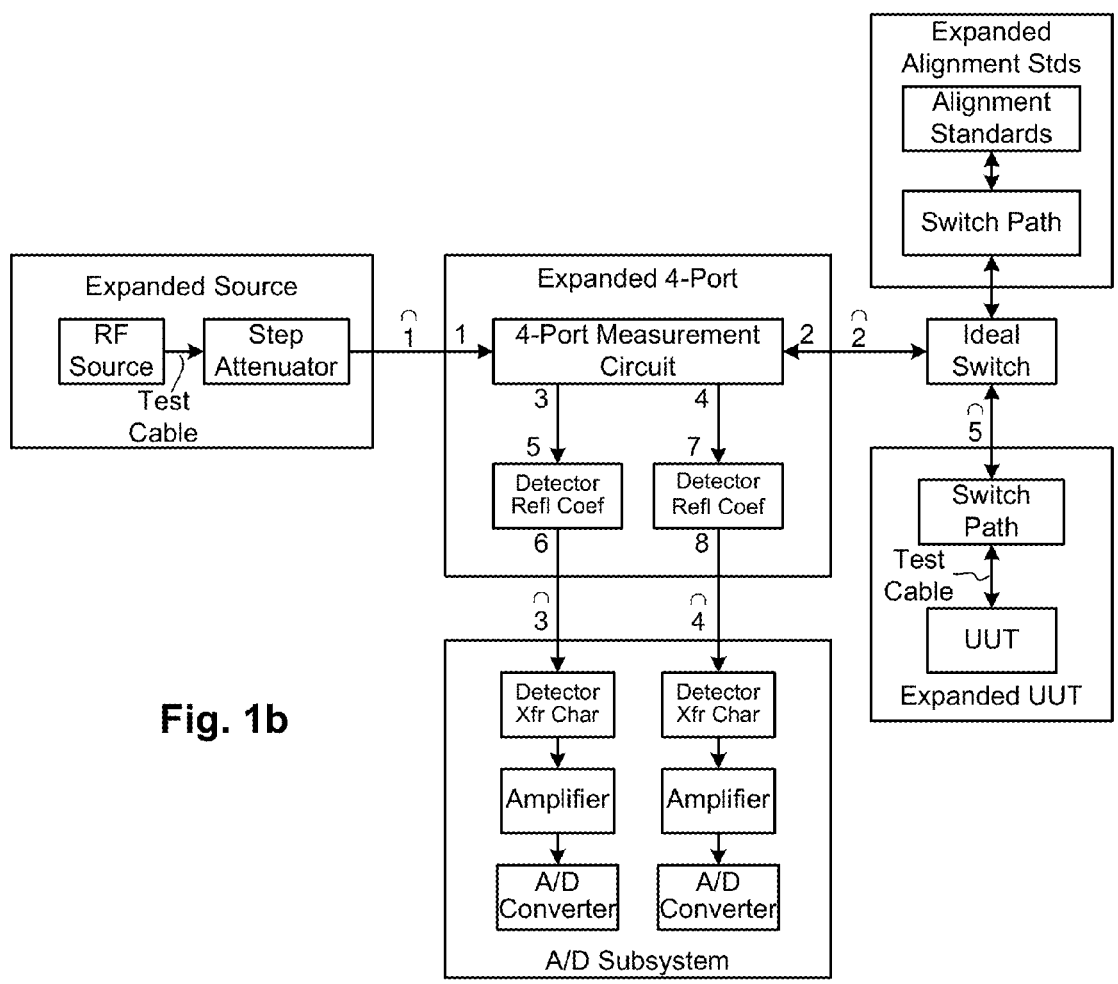
FIGS. 1b and 1c collectively illustrate a progressive encapsulation of circuitry shown in FIG. 1a, that effectively allow the probe and UUT to be mathematically represented as a 3-port system, and the UUT reflection coefficient to be solved as a function of known scattering parameters of the probe and the measurements at the outputs of the probe detectors.
Figure 1C:
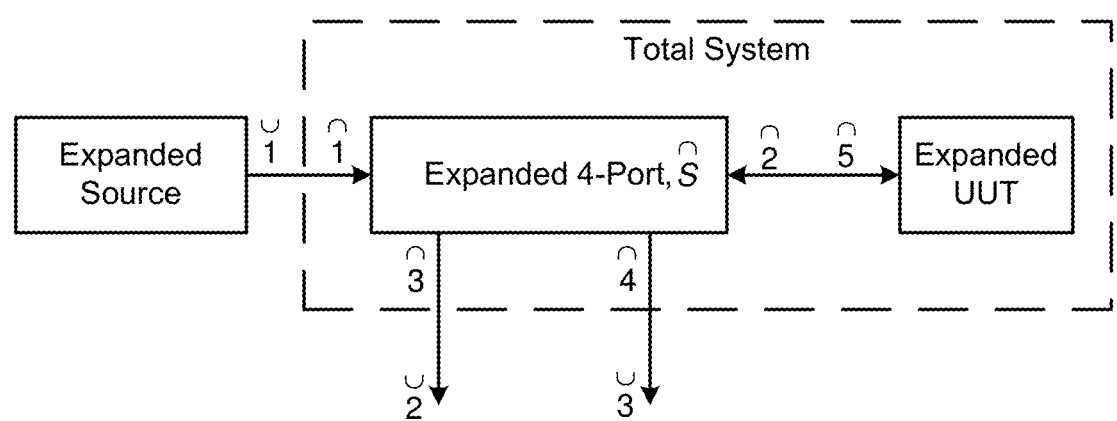

In more detail, and with respect to the expanded 4-port measurement circuit, the complex reflection coefficients of the detectors are combined into the scattering matrix of the 4-port measurement circuit, to provide the scattering matrix of the expanded 4-port as shown in FIG. 1b. This expanded 4-port correctly accounts for the effect of reflections from the detectors (designated as Detector Refl Coef in FIG. 1b). As can be seen, a port numbering scheme is used for designation purposes only, to facilitate description of the various s-parameters. The $S_{56}$ and $S_{78}$ parameters are assigned values of 1, since the actual detector transfer functions are embodied separately in the boxes designated as Detector Xfr Char in FIG. 1b. The $\hat{S}_{33}$ and $\hat{S}_{44}$ parameters of the Detector Xfr Char in FIG. 1b are assigned values of 0 since the actual detector reflection coefficients are embodied separately as $S_{55}$ and $S_{77}$ in the boxes designated as Detector Refl Coef in FIG. 1b.

In the intermediate view of the partially encapsulated DTF system shown in FIG. 1b, the UUT, UUT test cable and switch path are encapsulated to provide the expanded UUT, and the alignment standards and switch path are similarly encapsulated in an expanded alignment standards. In addition, the RF source (including the step attenuator) and source test cable are encapsulated into the expanded source. The ports of the 4-port measurement circuit are numbered 1 through 4. The ports of the expanded 4-port are numbered $\hat{1}$ through $\hat{4}$. The one port of the expanded UUT is designated $\hat{5}$. If one of the expanded alignment standards is switched in instead of the expanded UUT, then the equations derived for port $\hat{5}$ of the expanded UUT will also be applicable for the one port of the expanded alignment standards.

The scattering matrix of the expanded 4-port of FIG. 1b can be formulated in terms of the scattering parameters of its components. The partitioned matrix equation shown here can be formed using conventional procedures (e.g., such as the procedure outlined in, "The Junction Matrix in the Analysis of Scattering Networks," by Jacob Shekel, IEEE Trans. Circuits & Systems, January 1974), with the a's and b's arranged so that the rows denoting the external ports are on top:

$$\begin{bmatrix} b_1 \\ b_2 \\ b_6 \\ b_8 \\ \vdots \\ b_3 \\ b_4 \\ b_5 \\ b_7 \end{bmatrix} =$$

$$\begin{bmatrix} S_{11} & S_{12} & 0 & 0 & \vdots & S_{13} & S_{14} & 0 & 0 \\ S_{21} & S_{22} & 0 & 0 & \vdots & S_{23} & S_{24} & 0 & 0 \\ 0 & 0 & S_{66}=0 & 0 & \vdots & 0 & 0 & S_{65} & 0 \\ 0 & 0 & 0 & S_{88}=0 & \vdots & 0 & 0 & 0 & S_{87} \\ \ldots & \ldots & \ldots & \ldots & \vdots & \ldots & \ldots & \ldots & \ldots \\ S_{31} & S_{32} & 0 & 0 & \vdots & S_{33} & S_{34} & 0 & 0 \\ S_{41} & S_{42} & 0 & 0 & \vdots & S_{43} & S_{44} & 0 & 0 \\ 0 & 0 & S_{56}=\sqrt{1-(S_{55})^2} & 0 & \vdots & 0 & 0 & S_{55} & 0 \\ 0 & 0 & 0 & S_{78}=\sqrt{1-(S_{77})^2} & \vdots & 0 & 0 & 0 & S_{77} \end{bmatrix}$$

$$\begin{bmatrix} a_1 \\ a_2 \\ a_6=0 \\ a_8=0 \\ \ldots \\ a_3 \\ a_4 \\ a_5 \\ a_7 \end{bmatrix}.$$

As can be seen in this equation, normal scattering matrix notation is used, with the b's being the voltage waves leaving the ports, and the a's being the voltage waves incident on the ports.

With further reference to FIG. 1b, the connection information of the internal ports can be captured in a junction matrix, J, such that:

$$\begin{bmatrix} b_3 \\ b_4 \\ b_5 \\ b_7 \end{bmatrix} = J \begin{bmatrix} a_3 \\ a_4 \\ a_5 \\ a_7 \end{bmatrix}, \text{ where } J = \begin{bmatrix} 0 & 0 & 1 & 0 \\ 0 & 0 & 0 & 1 \\ 1 & 0 & 0 & 0 \\ 0 & 1 & 0 & 0 \end{bmatrix},$$

indicating that port 3 of the 4-port measurement circuit is connected to port 5 of the detector reflection coefficient and port 4 of the 4-port measurement circuit is connected to port 7 of the detector reflection coefficient. The partitioned matrix equation can be denoted in shorthand notation as:

$$\begin{bmatrix} y_1 \\ \dots \\ y_2 \end{bmatrix} = \begin{bmatrix} u_{11} & \vdots & u_{12} \\ \dots & \vdots & \dots \\ u_{21} & \vdots & u_{22} \end{bmatrix} \begin{bmatrix} x_1 \\ \dots \\ x_2 \end{bmatrix}.$$

Then, continuing with the matrix formulation procedure, $$\begin{bmatrix} b_1 \\ b_2 \\ b_6 \\ b_8 \end{bmatrix} = \hat{S} \begin{bmatrix} a_1 \\ a_2 \\ 0 \\ 0 \end{bmatrix}, \text{ where } \hat{S} = \{u_{11} - u_{12}(u_{22} - J)^{-1} u_{21}\}.$$

Note that $\hat{S}$ is the 4 by 4 scattering matrix of the expanded 4-port, which includes the reflection characteristics of the diode detectors.

As will now be discussed with reference to FIG. 1c, the expanded UUT can further be encapsulated in with the expanded 4-port using the same methods as discussed with reference to FIG. 1b. The resulting equation can then be used to solve for the reflection coefficient at port $\hat{5}$ of the UUT. In more detail, once $\hat{S}$ of the 4 by 4 scattering matrix of the expanded 4-port is computed, the scattering matrix of the 3-port total system shown in FIG. 1c can be derived, which includes the expanded 4-port $\hat{S}$ and the expanded UUT inside of it. Using this formulation, the UUT reflection coefficient can be solved as a function of known scattering parameters of the 4-port measurement circuit and the measurements at the outputs of the diode detectors. First, note in the circuit block diagram of FIG. 1c that the ports are renumbered. The total system external port numbers $\check{1}$ through $\check{3}$ are designated with bowls, whereas the internal port numbers $\hat{1}$ through $\hat{5}$ have hats. This designation scheme is simply used to distinguish internal ports from external port and to facilitate description.

Then, the same type of matrix equation can be formed as previously (e.g., using the procedure outlined in, "The Junction Matrix in the Analysis of Scattering Networks," by Shekel), with the a's and b's for the external ports in the top rows and the a's and b's for the internal ports in the bottom rows:

$$\begin{bmatrix} \hat{b}_1 \\ \hat{b}_3 \\ \hat{b}_4 \\ \dots \\ \hat{b}_2 \\ \hat{b}_5 \end{bmatrix} = \begin{bmatrix} \hat{S}_{11} & \hat{S}_{13} & \hat{S}_{14} & \vdots & \hat{S}_{12} & 0 \\ \hat{S}_{31} & \hat{S}_{33} & \hat{S}_{34} & \vdots & \hat{S}_{32} & 0 \\ \hat{S}_{41} & \hat{S}_{43} & \hat{S}_{44} & \vdots & \hat{S}_{42} & 0 \\ \dots & \dots & \dots & \vdots & \dots & \dots \\ \hat{S}_{21} & \hat{S}_{23} & \hat{S}_{24} & \vdots & \hat{S}_{22} & 0 \\ 0 & 0 & 0 & 0 & 0 & \hat{S}_{55} \end{bmatrix} \begin{bmatrix} \hat{a}_1 \\ \hat{a}_3 = 0 \\ \hat{a}_4 = 0 \\ \dots \\ \hat{a}_2 \\ \hat{a}_5 \end{bmatrix}.$$

The connection information of the internal ports can be captured in a junction matrix, J, such that:

$$\begin{bmatrix} \hat{b}_2 \\ \hat{b}_5 \end{bmatrix} = \hat{J} \begin{bmatrix} \hat{a}_2 \\ \hat{a}_5 \end{bmatrix}, \text{ where } \hat{J} = \begin{bmatrix} 0 & 1 \\ 1 & 0 \end{bmatrix}.$$

The partitioned matrix equation can be denoted in shorthand notation as:

$$\begin{bmatrix} \hat{y}_1 \\ \dots \\ \hat{y}_2 \end{bmatrix} = \begin{bmatrix} \hat{u}_{11} & \vdots & \hat{u}_{12} \\ \dots & \vdots & \dots \\ \hat{u}_{21} & \vdots & \hat{u}_{22} \end{bmatrix} \begin{bmatrix} \hat{x}_1 \\ \dots \\ \hat{x}_2 \end{bmatrix}.$$

Then, $$\begin{bmatrix} \hat{b}_1 \\ \hat{b}_3 \\ \hat{b}_4 \end{bmatrix} = \breve{S} \begin{bmatrix} \hat{a}_1 \\ 0 \\ 0 \end{bmatrix}, \text{ where } \breve{S} = \{\hat{u}_{11} - \hat{u}_{12}(\hat{u}_{22} - \hat{J})^{-1} \hat{u}_{21}\}.$$

Substituting in the scattering parameters of the expanded 4-port:

$$\begin{bmatrix} \hat{b}_1 \\ \hat{b}_3 \\ \hat{b}_4 \end{bmatrix} = a_1 \left\{ \begin{bmatrix} \hat{S}_{11} \\ \hat{S}_{31} \\ \hat{S}_{41} \end{bmatrix} - \begin{bmatrix} \hat{S}_{12} \\ \hat{S}_{32} \\ \hat{S}_{42} \end{bmatrix} \frac{\hat{S}_{21}}{\hat{S}_{22} - \frac{1}{\hat{S}_{55}}} \right\}.$$

Solving for the reflection coefficient of the expanded UUT:

$$\hat{S}_{55} = \left\{ \hat{S}_{22} - \hat{S}_{n2}\hat{S}_{21} \left( \hat{S}_{n1} - \left| \frac{\hat{b}_n}{a_1} \right| e^{j\hat{\theta}_n} \right)^{-1} \right\}^{-1},$$

where n=1, 3 or 4. However, no information is known about $\hat{b}_1$ (the voltage reflected by the expanded 4-Port), so only the two equations involving $\hat{b}_3$ and $\hat{b}_4$ are useful. In addition, note that, in this equation, the magnitudes of $\hat{b}_3$ and $\hat{b}_4$ are measured relative to $a_1$ but not their phases (explicitly denoted by $\hat{\theta}_n$), because the detectors are only capable of measuring amplitude.

The two equations can be set equal to each other (for n=3 and n=4) to allow for solving the two unknown phases, $\hat{\theta}_3$ and $\hat{\theta}_4$, as shown here:

$$\left\{ \hat{S}_{22} - \hat{S}_{32}\hat{S}_{21} \left( \hat{S}_{31} - \left| \frac{\hat{b}_3}{a_1} \right| e^{j\hat{\theta}_3} \right)^{-1} \right\}^{-1} = \left\{ \hat{S}_{22} - \hat{S}_{42}\hat{S}_{21} \left( \hat{S}_{41} - \left| \frac{\hat{b}_4}{a_1} \right| e^{j\hat{\theta}_4} \right)^{-1} \right\}^{-1}$$

$$\Rightarrow \frac{\hat{S}_{32}}{\hat{S}_{31} - \left| \frac{\hat{b}_3}{a_1} \right| e^{j\hat{\theta}_3}} = \frac{\hat{S}_{42}}{\hat{S}_{41} - \left| \frac{\hat{b}_4}{a_1} \right| e^{j\hat{\theta}_4}}$$

$$\Rightarrow \frac{\hat{S}_{31}}{\hat{S}_{32}} + \left| \frac{\hat{b}_3}{\hat{S}_{32} a_1} \right| e^{j(\hat{\theta}_3 - \arg(\hat{S}_{32}) - \pi)}$$

$$= \frac{\hat{S}_{41}}{\hat{S}_{42}} + \left| \frac{\hat{b}_4}{\hat{S}_{42} a_1} \right| e^{j(\hat{\theta}_4 - \arg(\hat{S}_{42}) - \pi)}.$$

This equation is in the form of two circles set equal to each other:

$$c_3 + r_3 e^{j\phi_3} = c_4 + r_4 e^{j\phi_4}$$

Then, the two intersection points (if they exist) can be found using conventional circle-circle intersection techniques. Once the two solutions for $\phi_3$ or $\phi_4$ are found, they can be plugged into these equations to solve for the two potential solutions for the reflection coefficient of the UUT, $\hat{S}_{55}$.

Figure 6:
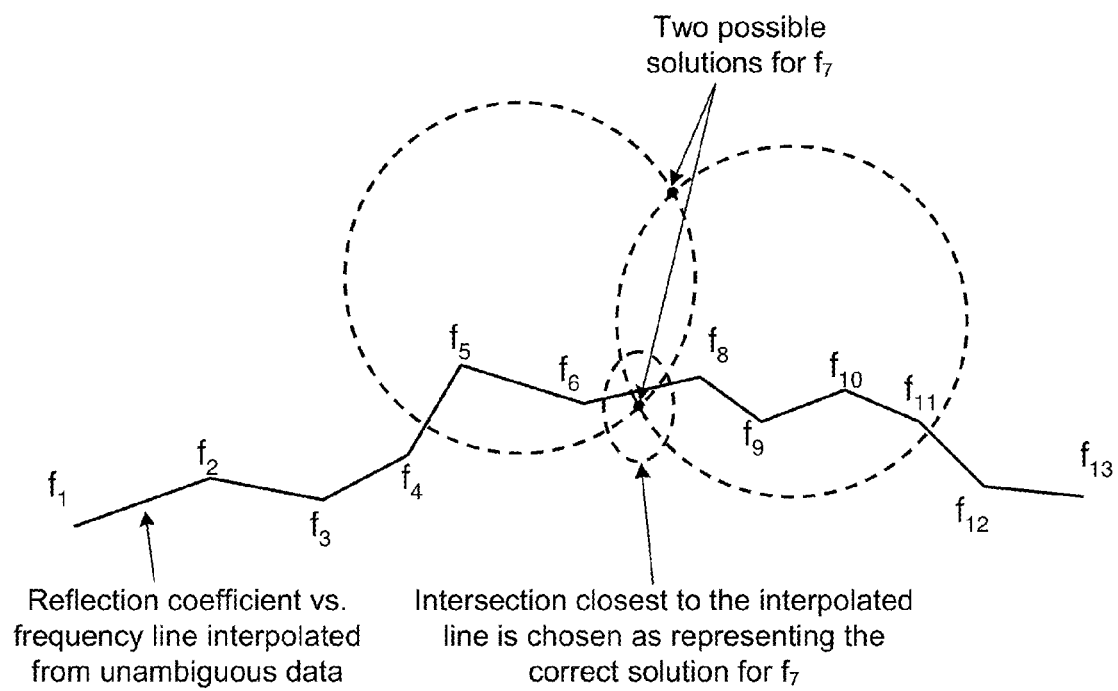
FIG. 6 demonstrates the realization that the equations to be solved in computing a complex reflection coefficient of a UUT are in the form of two intersecting circles, wherein the points of intersection represent possible reflection coefficient estimates, in accordance with an embodiment of the present invention.

In general, any $\hat{S}_{55}$ magnitude greater than 1 is impossible, and the other solution should then be chosen as the correct one. If both solutions have magnitudes greater than 1 (due to measurement error) then one possible strategy is to pick the one that has the smaller magnitude. If the two circles do not intersect (due to measurement error), then the point halfway in the gap between the two circumferences can be chosen. Once the matrix of solutions is obtained (at some frequency points, there will be a single viable solution, at others there will be two), then one can interpolate through the frequencies containing single viable solutions and use this interpolated curve to eliminate the ambiguities for the frequencies with two viable solutions (as will be further discussed and demonstrated with reference to FIG. 6.

Methodology

Figure 2A:
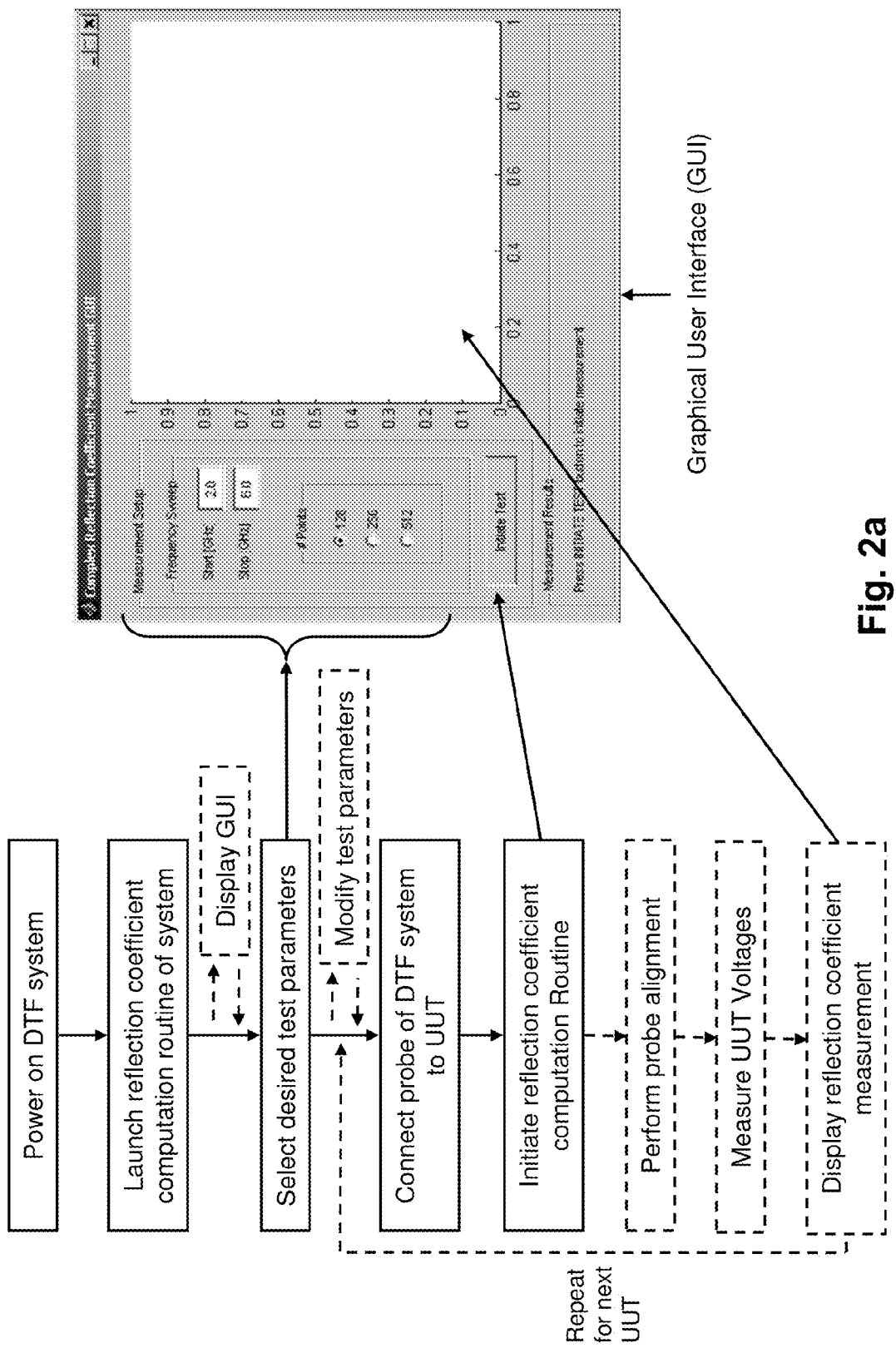
FIG. 2a illustrates a method for computing a complex reflection coefficient using a DTF system, in accordance with an embodiment of the present invention.

FIG. 2a illustrates a method for computing a complex reflection coefficient using a DTF system such as the one shown in FIG. 1a, in accordance with an embodiment of the present invention. The method may include functionality of both manual and automatic steps. In particular, a user of the system can perform manual steps such as those shown with solid line boxes, and a computer operatively coupled to the system can perform automatic steps such as those shown with dashed lines. In one example such embodiment, the automated steps of the method are implemented in software instructions programmed into or otherwise executable by a processor (e.g., shown in FIG. 1a) of a laptop. The instructions may be encoded in any suitable computer readable medium accessible (e.g., ROM, flash, hard drive, server, memory stick, compact disc, or other such processor-readable mediums) by the processor. Alternatively, the automated steps of the method can be implemented in hardware such as gate level logic (e.g., ASIC or FPGA) configured to execute the methodology. Alternatively, the automated steps of the method can be implemented in firmware such as with a microcontroller having I/O capability and a number of embedded routines configured to execute the methodology. Any number of such software, hardware, or firmware implementations (or combinations thereof) for carrying out the methodology will be apparent in light of this disclosure.

As can be seen, the method begins with a number of manual steps carried out by the user, including powering on the DTF system and launching the complex reflection coefficient computation routine. Upon the user launching the complex reflection coefficient computation routine, the method further continues with automatically displaying a graphical user interface (GUI) on a display area viewable by the user. For embodiments where the processor is included in a laptop or other such portable computing device operatively coupled to the probe (e.g., via an Ethernet or other suitable connection), this display area may be, for example, an LCD display. Alternatively, for embodiments having an integrated processor within the probe itself, the display area may be a smaller LCD display configured into the probe housing. Alternatively, the user interface can be implemented without graphical display, as a set of switches that have positions associated with known parameter settings that allow the user to select a desired test parameter setup. In such a case, complex reflection coefficient computation results could be stored, for example, in a memory for later download into a computer.

The method of this example embodiment continues with the user selecting the desired test parameters. In the example case shown, the interface allows the user to specify the frequency sweep (including start and stop frequencies) as well as the sweep resolution (i.e., number of data points making up each sweep). The method further includes automatically modifying the test parameters based on the user's selections. The method continues with the user connecting the probe of the DTF system to the target UUT, and initiating the complex reflection coefficient computation routine by selecting the "Initiate Test" button on the GUI. Note that the modification of test parameters based on user selections can take place, for example, real-time as the user makes each selection. Alternatively, the modifications may take place at the point when all selections are made and the user initiates the complex reflection coefficient computation routine. Further note that the method may be configured to automatically initiate the complex reflection coefficient computation routine, for example, once it senses that the UUT is properly connected to the probe (e.g., based on an established resistance range associated with UUTs when properly connected).

In response to initiation of the complex reflection coefficient computation routine, the method continues with automatically performing probe alignment, so that the measured alignment voltages can be used to mathematically adjust calibration values (e.g., stored in calibration tables accessible to the probe) for better accuracy. This alignment procedure will be discussed in more detail with reference to FIG. 2b. The method continues with automatically measuring UUT voltages, so that the measured UUT voltages along with the calibration and alignment data can be used to mathematically compute the complex reflection coefficient of the UUT. This measuring UUT voltages procedure will be discussed in more detail with reference to FIG. 2c. The method continues with automatically displaying or otherwise communicating the computed complex reflection coefficient measurement to the user (e.g., via the GUI).

Probe Alignment

Figure 2B:
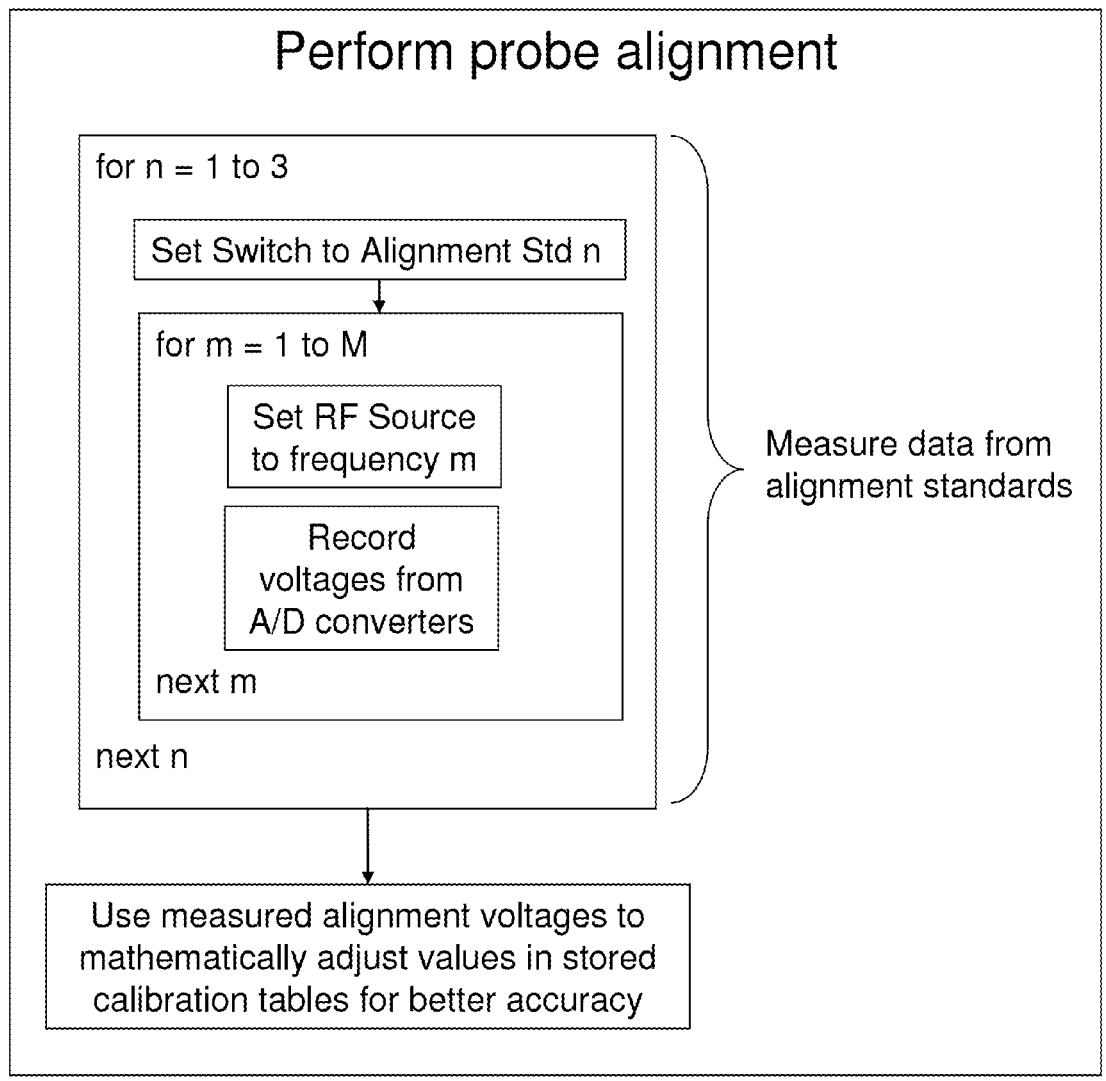
FIG. 2b illustrates a method for performing alignment in the method shown in FIG. 2a, in accordance with an embodiment of the present invention.

FIG. 2b illustrates a method for performing alignment in the method shown in FIG. 2a, in accordance with an embodiment of the present invention.

As can be seen, the probe alignment method of this example embodiment employs a nested loop, wherein for each of N alignment standards, the voltages output by the A/D converters of the probe (as shown in FIG. 1a) at each of M frequencies are recorded. For this example application, there are three alignment standards (i.e., N=3), but any number of alignment standards can be used, depending of the application. The alignment standards will be discussed in further detail with reference to FIG. 3. The M frequencies can be provided by the RF source shown in FIG. 1a (e.g., as commanded by the processor), wherein the value of M can be set depending on factors such as desired resolution/accuracy and processing time (e.g., the greater the value of M, the greater the resolution/accuracy but the slower the processing time).

In any case, as the next loop executes, the alignment method causes the switch (FIG. 1a) to switch in the appropriate alignment standard. Then, the alignment method sets the RF source to the frequency m, and records the output voltages of the A/D converters of the probe. These source adjusting and recording steps are repeated for each of the M frequencies. Once voltages for all M frequencies have been recorded, the next alignment standard is switched in, and the source adjusting and recording steps are repeated. The method continues until fulfillment of the nested loop, where all alignment standards have been switched in and the corresponding A/D converter output voltages recorded at each of the M frequencies.

The method continues with using the measured alignment voltages (the A/D converter output voltages measured during execution of the nested loop) to mathematically adjust alignment standard values stored calibration files (e.g., tables), thereby improving the accuracy of the stored calibration data. In more detail, a small error in the probe scattering parameters (e.g., measured on a microwave network analyzer and enshrined in calibration tables stored in probe memory) can result in a large error in the complex reflection coefficient estimate. These small errors are due to the normal inaccuracies inherent in all measurements, including those obtained with microwave network analyzers. To improve the complex reflection coefficient accuracy, the probe alignment method uses the real-time measurements output by the A/D converter (e.g., performed automatically as directed by the processor in the seconds just prior to the complex reflection coefficient measurement) from the alignment standards to adjust the stored scattering parameters so that the measured voltages conform to the computed ones, prior to using them to estimate the complex reflection coefficient of the UUT, which significantly improves the complex reflection coefficient accuracy.

Figure 3:
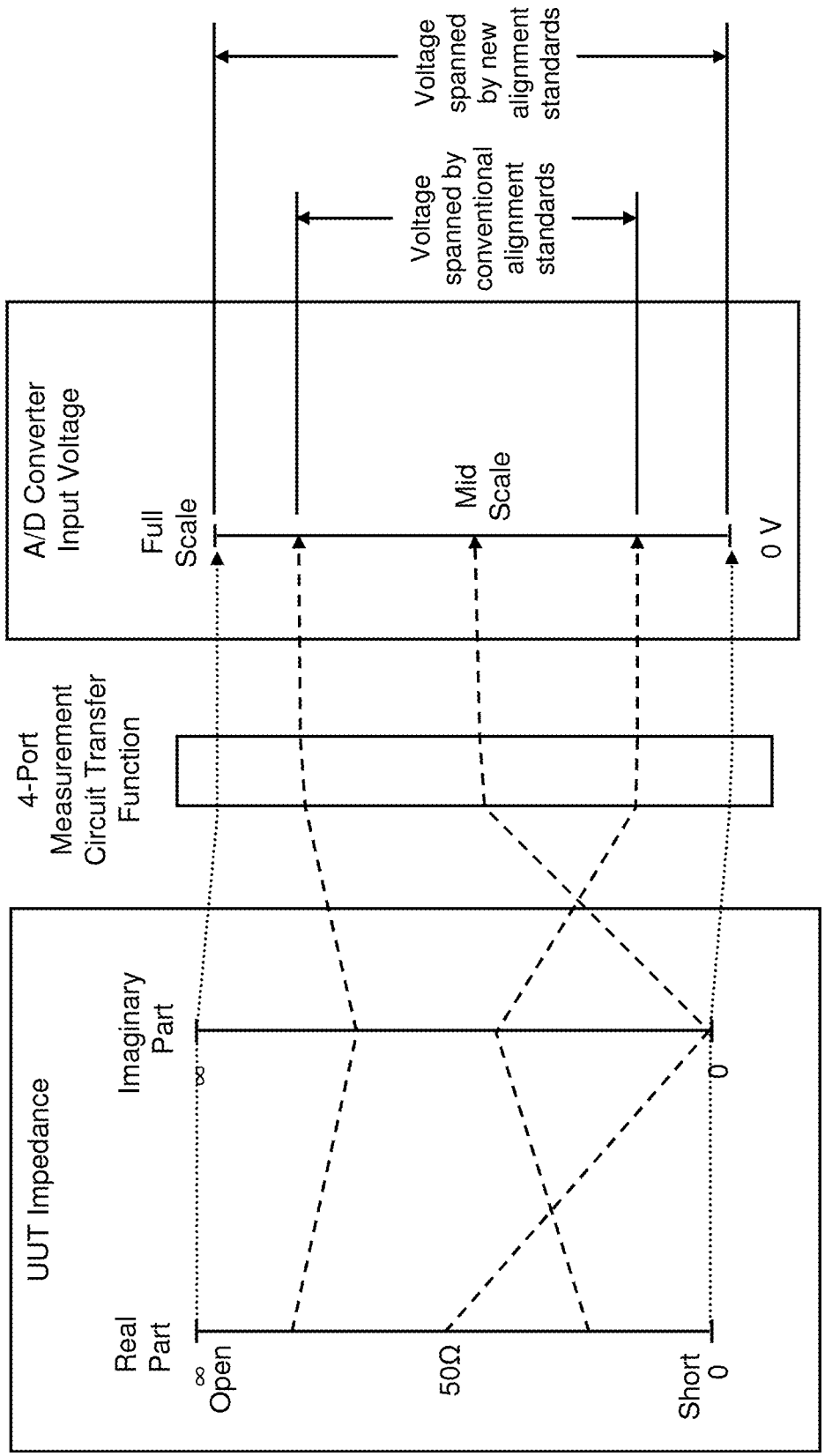
FIG. 3 demonstrates a probe alignment procedure that uses three alignment standards, in accordance with an embodiment of the present invention, and benefits relative to conventional alignment standards.

As previously explained and further depicted in FIG. 3, the probe alignment method shown in FIG. 2b uses three alignment standards, and results in improved complex reflection coefficient estimation accuracy and reduced complexity and duration of the alignment procedure. Deriving the coefficients of the quadratic transfer function would generally require voltage measurements from known alignment standards that span most of possible voltage range, or else any values extrapolated to higher or lower voltages would be inaccurate. Shorts (resistance=0) and opens (resistance=infinite) give the largest voltage swings at the A/D converter. With this in mind, and in accordance with an embodiment of the present invention, three alignment standards are employed: an open circuit, a short circuit, and a 50 ohm broadband matched load. The open and short result in A/D converter input voltages at opposite extremes (effectively covering the full range of the A/D converter), while the matched load gives a data point in the middle of the A/D converter range, as shown in FIG. 3. As can be seen, the voltage spanned by the alignment standards as described herein is significantly larger than the voltage spanned by conventional alignment standards. As will be appreciated in light of this disclosure, use of these three alignment standards obviates any need to adjust the RF source power (in order to enable calibration over a wide range of A/D converter input voltages) during the probe alignment process.

Other enhancements to the alignment procedure will be apparent in light of this disclosure. For instance, conventional probe alignment algorithms generally assume a straight line detector transfer function. This straight line took the form of:

Output [Volts]=gain×input [dBm]+offset (for DLVA detectors)

Output [Volts]=gain×input [mW]+offset (for diode detectors)

Figure 4A:
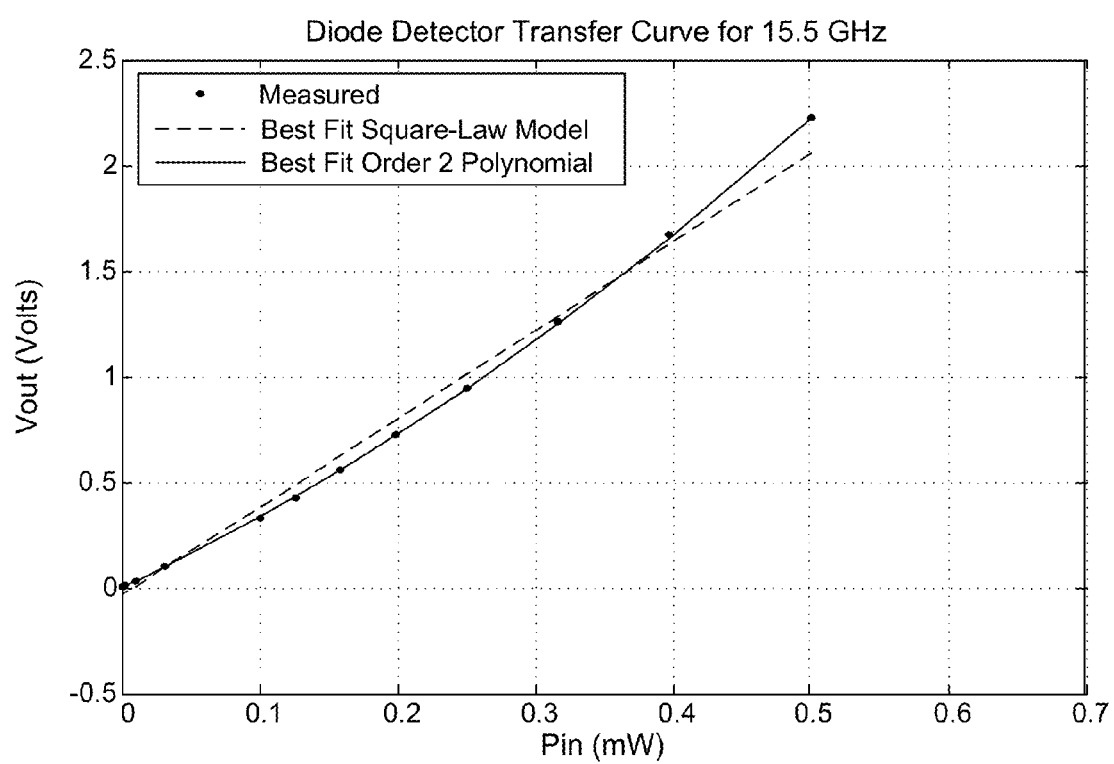
FIG. 4a is a plot illustrating transfer function curves for a diode detector at 15.5 GHz.
Figure 4B:
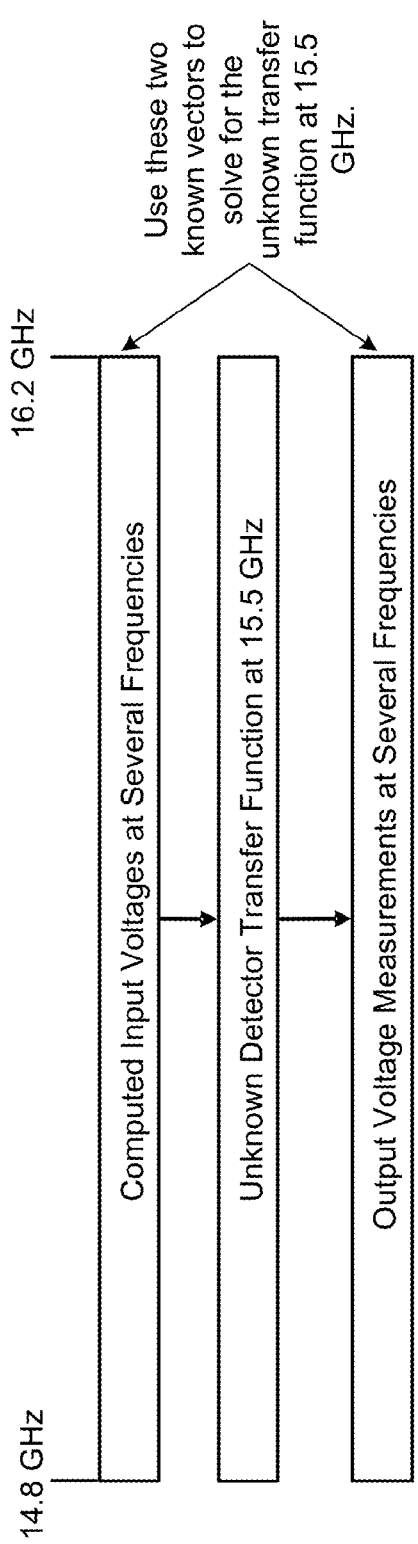
FIG. 4b graphically illustrates a sliding window (in frequency) procedure that can be used to provide sufficient data to solve for the quadratic coefficients used in modeling the transfer function of the detector diode of FIG. 4a at each frequency, in accordance with an embodiment of the present invention.
Figure 4B:
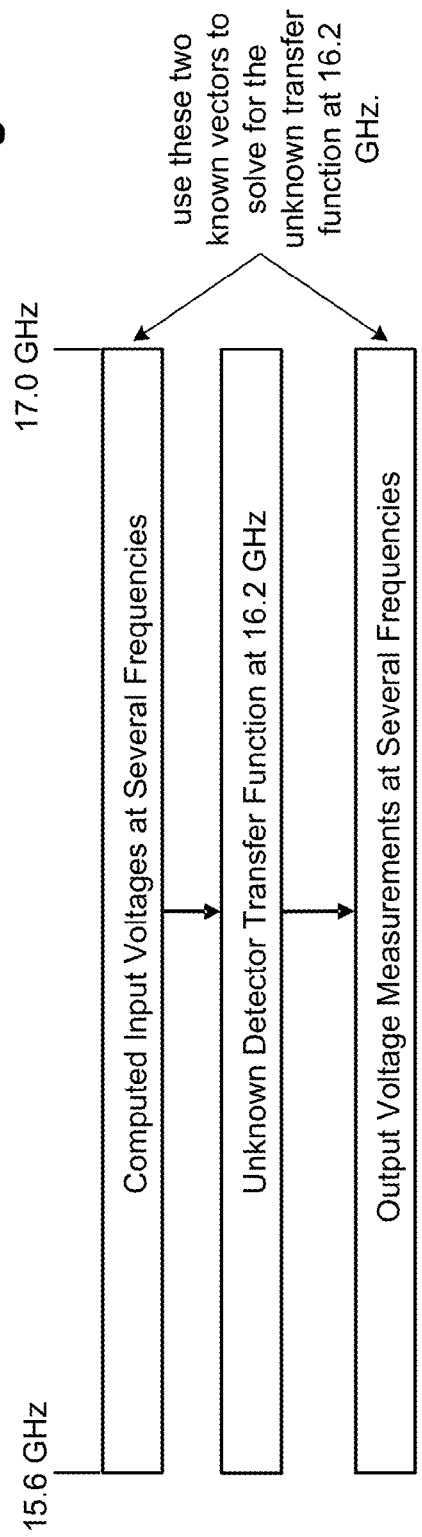

However, as shown in FIG. 4a, diode detectors are not ideal square law devices. As such, they are better modeled with a quadratic (polynomial order 2) equation. With this in mind, and in accordance with an embodiment of the present invention, a sliding window (in frequency) is used to provide enough data to solve for the quadratic coefficients required to model the transfer function at each frequency of interest. So, for instance, and with further reference to the plot of FIG. 4a, the input powers (as computed from the known alignment standards and the known 4-port scattering matrix) and measured output voltages of a diode detector over the example frequency range of, 14.8 GHz to 16.2 GHz can be used to derive the quadratic coefficients of the curve at the mid point of 15.5 GHz, represented by the solid line in the plot of FIG. 4a. If using just the measurements from 15.5 GHz does not provide enough data to accurately solve for the quadratic coefficients, data from nearby frequencies can be used as well, since the coefficients change slowly with frequency. FIG. 4b graphically illustrates this procedure, where computed input voltages at several frequencies and output voltage measurements at several frequencies are used to compute the unknown detector transfer function at 15.5 GHz. As can be seen, the overlapping windows slide in frequency (i.e., the first window from 14.8-16.2 GHz and the second window 15.6-17.0 GHz).

Because a quadratic equation has enough degrees of freedom to allow it to be non-monotonic, a 'make monotonic' algorithm can be employed to enforce monotonicity on the detector transfer function, in accordance with an embodiment of the present invention. If the algorithm finds a section of the transfer function that has a different slope sign than the rest, it modifies data points so that all slopes have the same sign. For instance, the following example has one point in vector_in that is non-monotonic (i.e., the point with the value 12.1 is the only point that is larger than the point to its right), so that line segment is the only place where the slope is negative:

vector_in=[0 2 4 8 12.1 12 14 16 18 20 22 24].

Now, processing the non-monotonic vector through a make_monotonic function produces an output vector (vector_out) that is a modified monotonic version of the input vector (vector_in), so that the slope now is positive for every line segment.

vector_out=make_monotonic(vector_in)

vector_out=[0 2 4 8 10 12 14 16 18 20 22 24]

As can be seen, the make_monotonic algorithm is programmed or otherwise configured to replace the non-monotonic point with the value 12.1 with a monotonic point with the value 10. The algorithm can be coded to select the closest monotonic point with which to make the replacement based, for instance, on the average distance between neighboring points in the vector.

Measure UUT Voltages

Figure 2C:
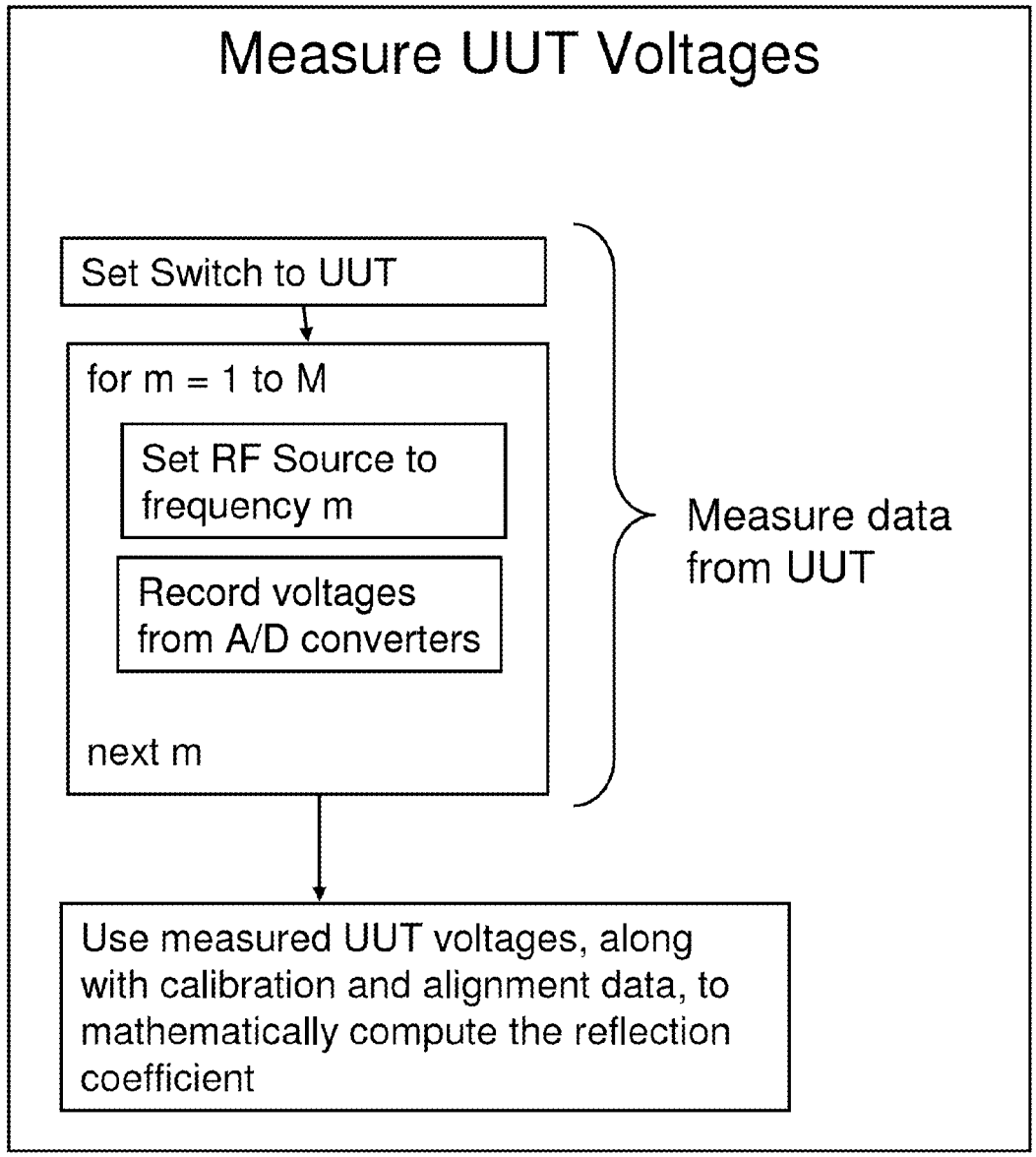
FIG. 2c illustrates a method for measuring UUT data in the method shown in FIG. 2a, in accordance with an embodiment of the present invention.

FIG. 2c illustrates a method for measuring UUT data in the method shown in FIG. 2a, in accordance with an embodiment of the present invention.

As can be seen, the method for measuring UUT voltage of this example embodiment employs a loop, wherein the voltages output by the A/D converters of the probe (as shown in FIG. 1a) at each of M frequencies are recorded. As previously explained, the M frequencies can be provided by the RF source shown in FIG. 1a (e.g., as commanded by the processor), wherein the value of M can be set depending on factors such as desired resolution/accuracy, processing time, etc. In one example embodiment, M is selected such that voltage measurements at the A/D converter outputs is made every 50 KHz across the frequency band of interest.

Figure 5A:
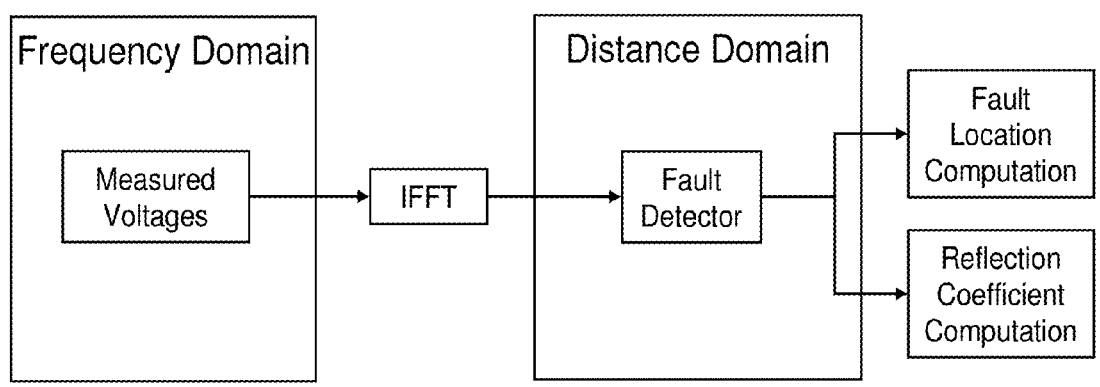
FIG. 5a illustrates a DTF algorithm that employs an inverse fast Fourier transform on measured UUT data, to transform it from the frequency domain to the distance domain, and then locates faults and computes a complex reflection coefficient.
Figure 5B:
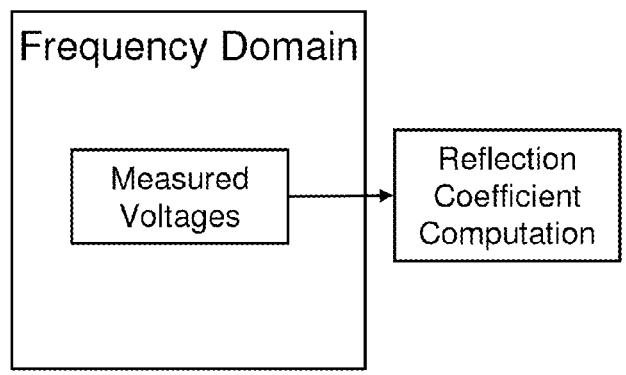
FIG. 5b illustrates a DTF algorithm capable of computing a complex reflection coefficient without using an inverse fast Fourier transform on measured UUT data, in accordance with an embodiment of the present invention.

In any case, the UUT measurement method of FIG. 2c causes the switch (FIG. 1a) to switch in the UUT. Then, the measurement loop executes where the method sets the RF source to the frequency m, and records the output voltages of the A/D converters of the probe. These source adjusting and recording steps are repeated for each of the M frequencies. Once voltages for all M frequencies have been recorded, the method continues with using the measured UUT voltages (the A/D converter output voltages measured during execution of the loop), along with calibration and probe alignment data, to mathematically compute the complex reflection coefficient of the UUT. This complex reflection coefficient computation can be carried out as previously described with respect to FIGS. 1a-c, which may further include enhanced alignment standards as described with reference to FIGS. 3 and 4a-b. This computation is accomplished using a detection statistic that is less computationally complex, relative to conventional techniques, thereby allowing for faster execution and display of the computed complex reflection coefficient. In particular, one known DTF algorithm employs an inverse fast Fourier transform (IFFT) on the measured UUT data, to transform it from the frequency domain to the distance domain. The peaks in this distance-domain data are then detected, and mathematically analyzed to compute fault complex reflection coefficient estimates. One such conventional DTF algorithm is generally demonstrated in FIG. 5a, and is further explained in the previously incorporated U.S. Pat. Nos. 7,061,221, 7,061,251, 7,171,322, and U.S. Pat. No. 7,254,511. In accordance with an embodiment of the present invention, and as shown in FIG. 5b, the measured UUT voltages from the frequency domain can be used to compute the complex reflection coefficient, thereby eliminating the need for preprocessing with an IFFT.

A benefit of this complex reflection coefficient computation technique is a more intuitive detection statistic display that inherently removes the transmission line loss, where the magnitude of the detection statistic peak is truly the magnitude of the fault complex reflection coefficient, without a need to make a mathematical conversion (i.e., no IFFT). This improved computation is based on the realization that the equations to be solved are in the form of two intersecting circles. Two intersecting circles have at most two points of intersection, representing two possible complex reflection coefficient estimates. Valid complex reflection coefficient magnitudes are confined to the range of 0 to 1, so in many cases one of the potential solutions may be discarded because it violates this rule.

In cases where both potential solutions are in the range of 0 to 1, the complex reflection coefficient computation algorithm can be programmed or otherwise configured to choose the solution closest to the line computed by interpolating the solutions at non-ambiguous frequencies to the ambiguous frequencies. This is demonstrated in FIG. 6, which shows the reflection coefficient verse frequency line interpolated from unambiguous data. As can be seen, there are two intersection points between the two circles, but one of the intersection points is closer to the interpolated line. It is this point that represents the UUT's reflection coefficient estimate.

Other enhancements to the UUT measurement procedure will be apparent in light of this disclosure. For instance, one enhancement that can be used is video averaging to reduce residual alignment errors, which also improves complex reflection coefficient estimation accuracy. In more detail, there remains some zero mean residual complex reflection coefficient estimation error after performing the probe alignment. To reduce the effect of this error, video averaging can be used on the complex reflection coefficient estimate.

Other enhancements that may directly or indirectly impact the complex reflection coefficient estimate include tuning various algorithm parameters to improve complex reflection coefficient accuracy. For instance, example parameters that can be tuned or otherwise optimized include the size of the sliding window used in the probe alignment algorithm, the choice of the polynomial order used to model the detector transfer functions, the size of the complex reflection coefficient video averaging window, and the complex reflection coefficient detection threshold.

Figure 7:
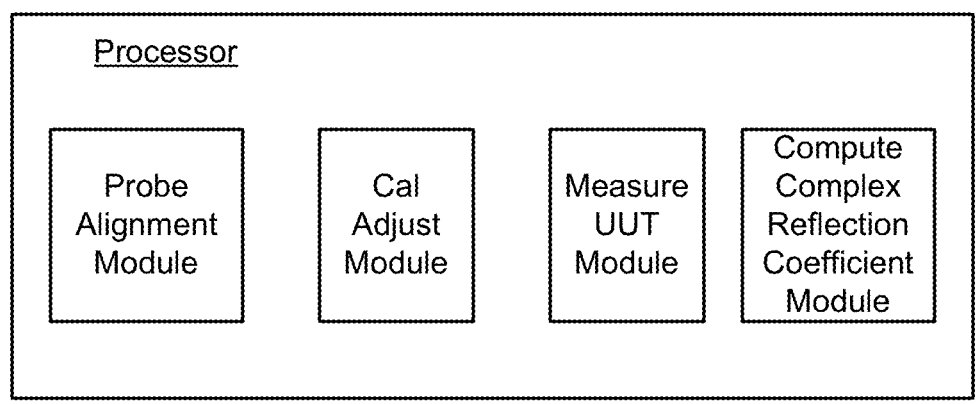
FIG. 7 is a block diagram of the processor of the DTF system shown in FIG. 1a, configured in accordance with an embodiment of the present invention.

FIG. 7 is a block diagram of the processor of the DTF system shown in FIG. 1a, configured in accordance with an embodiment of the present invention. As can be seen, the processor includes a number of modules, including a probe alignment module, a cal adjust module, a measure UUT module, and a compute complex reflection coefficient module. As previously explained, these modules can be implemented in software, hardware, firmware, or a combination thereof.

The probe alignment module is programmed or otherwise configured for performing probe alignment to produce measured alignment voltages. The cal adjust module is programmed or otherwise configured for adjusting calibration values based on the measured alignment voltages to produce adjusted calibration values. The measure UUT module is programmed or otherwise configured for measuring UUT voltages with the probe to produce measured UUT voltages. The compute complex reflection coefficient module is programmed or otherwise configured for computing a complex reflection coefficient of the UUT using the measured UUT voltages and the adjusted calibration values, wherein the complex reflection coefficient is computed as a function of known scattering parameters of a multi-port measurement circuit included in the probe, wherein in computing the complex reflection coefficient of the UUT, detectors of the probe are modeled with a quadratic (polynomial order 2) equation and a sliding window (in frequency) is used to provide sufficient data to solve for quadratic coefficients required to model detector transfer function at each frequency of interest. The probe alignment module uses three alignment standards, such that for each alignment standard, voltages output by analog-to-digital (A/D) converters of the probe at each of M frequencies are recorded. The three alignment standards including an open circuit, a short circuit, and a 50 ohm broadband matched load. The cal adjust module uses the voltages output by the A/D converters to mathematically adjust alignment of the calibration values. As previously explained, scattering parameters of the multi-port measurement circuit can be mathematically represented as a 4 by 4 scattering matrix that takes into account detectors included in the probe. In such cases, the 4 by 4 scattering matrix completely specifies transfer functions of the probe's multi-port measurement circuit, and is used in mathematically representing the DTF system and UUT to be: an expanded multi-port measurement circuit (as a function of the complex reflection coefficients of the detectors included in the probe); an expanded source (as a function of an RF source attenuator setting); and an expanded UUT (as a function of switch paths and alignment standards). Monotonicity may be enforced on the detector transfer function. As previously explained, the compute complex reflection coefficient module can be configured to solve equations that are in the form of two intersecting circles, such that points of intersection represent possible reflection coefficient estimates, and the complex reflection coefficient is computed using the reflection coefficient estimates.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for computing a complex reflection coefficient of a unit under test (UUT) with a distance to fault (DTF) system having a probe that is operatively coupled to the UUT, the method comprising:
performing probe alignment to produce measured alignment voltages at each of a plurality of frequencies;
adjusting calibration values based on the measured alignment voltages to produce adjusted calibration values;
measuring UUT voltages with the probe to produce measured UUT voltages at each of the frequencies; and
computing a complex reflection coefficient of the UUT at each of the frequencies using the measured UUT voltages and the adjusted calibration values, wherein the complex reflection coefficient is computed as a function of known scattering parameters of a multi-port measurement circuit included in the probe, and the scattering parameters account for complex reflection coefficients of the detectors included in the probe.

2. The method of claim 1 further comprising the preliminary steps of:
displaying a graphical user interface (GUI) on a display viewable by a user, thereby allowing a user to select desired test parameters of the DTF system; and
modifying test parameters of the DTF system based on the user selections.

3. The method of claim 1 further comprising: displaying the computed complex reflection coefficient of the UUT.

4. The method of claim 1 wherein the scattering parameters of the multi-port measurement circuit are mathematically represented as a 4 by 4 scattering matrix that takes into account the detectors included in the probe.

5. The method of claim 4 wherein the 4 by 4 scattering matrix completely specifies transfer functions of the probe's multi-port measurement circuit, and is used in mathematically representing the DTF system and UUT to be:
an expanded multi-port measurement circuit, as a function of the complex reflection coefficients of the detectors included in the probe;
an expanded source, as a function of an RF source attenuator setting; and
an expanded UUT, as a function of switch paths and alignment standards.

6. The method of claim 1 wherein:
performing probe alignment to produce measured alignment voltages includes use of one or more alignment standards, such that for each alignment standard, voltages output by analog-to-digital (A/D) converters of the probe at each of the frequencies are recorded; and
adjusting calibration values based on the measured alignment voltages to produce adjusted calibration values includes using the voltages output by the A/D converters to mathematically adjust alignment of the calibration values.

7. The method of claim 1 wherein performing probe alignment to produce measured alignment voltages includes use of three alignment standards, such that for each alignment standard, voltages output by analog-to-digital (A/D) converters of the probe at each of the frequencies are recorded, the three alignment standards including an open circuit, a short circuit, and a 50 ohm broadband matched load.

8. The method of claim 1 wherein in computing the complex reflection coefficient of the UUT, the detectors of the probe are modeled with a quadratic (polynomial order 2) equation and a sliding window (in frequency) is used to provide sufficient data to solve for quadratic coefficients required to model detector transfer function at each of the frequencies.

9. The method of claim 8 wherein monotonicity is enforced on the detector transfer function.

10. The method of claim 1 wherein:
measuring UUT voltages with the probe to produce measured UUT voltages includes recording voltages output by analog-to-digital (A/D) converters of the probe at each of the frequencies; and
computing a complex reflection coefficient of the UUT using the measured UUT voltages and the adjusted calibration values includes using the voltages output by the A/D converters.

11. The method of claim 1 wherein computing a complex reflection coefficient of the UUT using the measured UUT voltages and the adjusted calibration values involves solving equations that are in the form of two intersecting circles, such that points of intersection represent possible reflection coefficient estimates, and the complex reflection coefficient of the UUT is computed using the reflection coefficient estimates.

12. A non-transitory computer readable medium encoded with instructions that, when executed by a processor, cause a process to be carried out for computing a complex reflection coefficient of a unit under test (UUT) with a distance to fault (DTF) system having a probe that is operatively coupled to the UUT, the process comprising:
performing probe alignment to produce measured alignment voltages at each of a plurality of frequencies;
adjusting calibration values based on the measured alignment voltages to produce adjusted calibration values;
measuring UUT voltages with the probe to produce measured UUT voltages at each of the frequencies; and
computing a complex reflection coefficient of the UUT at each of the frequencies using the measured UUT voltages and the adjusted calibration values, wherein the complex reflection coefficient is computed as a function of known scattering parameters of a multi-port measurement circuit included in the probe, and the scattering parameters account for complex reflection coefficients of the detectors included in the probe.

13. The computer readable medium of claim 12 wherein the scattering parameters of the multi-port measurement circuit are mathematically represented as a 4 by 4 scattering matrix that takes into account the detectors included in the probe, and the 4 by 4 scattering matrix completely specifies transfer functions of the probe's multi-port measurement circuit, and is used in mathematically representing the DTF system and UUT to be:
an expanded multi-port measurement circuit, as a function of the complex reflection coefficients of the detectors included in the probe;
an expanded source, as a function of an RF source attenuator setting; and
an expanded UUT, as a function of switch paths and alignment standards.

14. The computer readable medium of claim 12 wherein:
performing probe alignment to produce measured alignment voltages includes use of one or more alignment standards, such that for each alignment standard, voltages output by analog-to-digital (A/D) converters of the probe at each of the frequencies are recorded;

adjusting calibration values based on the measured alignment voltages to produce adjusted calibration values includes using the voltages output by the A/D converters to mathematically adjust alignment of the calibration values.

15. The computer readable medium of claim 12 wherein performing probe alignment to produce measured alignment voltages includes use of three alignment standards, such that for each alignment standard, voltages output by analog-to-digital (A/D) converters of the probe at each of the frequencies are recorded, the three alignment standards including an open circuit, a short circuit, and a 50 ohm broadband matched load.

16. The computer readable medium of claim 12 wherein in computing a complex reflection coefficient of the UUT, the detectors of the probe are modeled with a quadratic (polynomial order 2) equation and a sliding window (in frequency) is used to provide sufficient data to solve for quadratic coefficients required to model detector transfer function at each of the frequencies.

17. The computer readable medium of claim 16 wherein monotonicity is enforced on the detector transfer function.

18. The computer readable medium of claim 12 wherein:
measuring UUT voltages with the probe to produce measured UUT voltages includes recording voltages output by analog-to-digital (A/D) converters of the probe at each of the frequencies; and
computing a complex reflection coefficient of the UUT using the measured UUT voltages and the adjusted calibration values includes using the voltages output by the A/D converters.

19. The computer readable medium of claim 12 wherein computing a complex reflection coefficient of the UUT using the measured UUT voltages and the adjusted calibration values involves solving equations that are in the form of two intersecting circles, such that points of intersection represent possible reflection coefficient estimates, and the complex reflection coefficient of the UUT is computed using the reflection coefficient estimates.

20. A distance to fault (DTF) system for computing a complex reflection coefficient of a unit under test (UUT), the system having a probe that can be operatively coupled to the UUT, the system comprising:
a probe alignment module for performing probe alignment to produce measured alignment voltages at each of a plurality of frequencies;
a cal adjust module for adjusting calibration values based on the measured alignment voltages to produce adjusted calibration values;
a measure UUT module for measuring UUT voltages with the probe to produce measured UUT voltages at each of the frequencies; and
a compute complex reflection coefficient module for computing a complex reflection coefficient of the UUT at each of the frequencies using the measured UUT voltages and the adjusted calibration values, wherein the complex reflection coefficient is computed as a function of known scattering parameters of a multi-port measurement circuit included in the probe, the scattering parameters accounting for complex reflection coefficients of the detectors included in the probe, wherein in computing the complex reflection coefficient of the UUT, the detectors of the probe are modeled with a quadratic (polynomial order 2) equation and a sliding window (in frequency) is used to provide sufficient data to solve for quadratic coefficients required to model detector transfer function at each frequency of interest;

wherein:
the probe alignment module uses three alignment standards, such that for each alignment standard, voltages output by analog-to-digital (A/D) converters of the probe at each of the frequencies are recorded, the three alignment standards including an open circuit, a short circuit, and a 50 ohm broadband matched load;
the cal adjust module uses the voltages output by the A/D converters to mathematically adjust alignment of the calibration values.

21. The system of claim 20 wherein the scattering parameters of the multi-port measurement circuit are mathematically represented as a 4 by 4 scattering matrix that takes into account the detectors included in the probe, and the 4 by 4 scattering matrix completely specifies transfer functions of the probe's multi-port measurement circuit, and is used in mathematically representing the DTF system and UUT to be:
an expanded multi-port measurement circuit, as a function of the complex reflection coefficients of the detectors included in the probe;
an expanded source, as a function of an RF source attenuator setting; and
an expanded UUT, as a function of switch paths and alignment standards.

22. The system of claim 20 wherein monotonicity is enforced on the detector transfer function.

23. The system of claim 20 wherein the compute complex reflection coefficient module solves equations that are in the form of two intersecting circles, such that points of intersection represent possible reflection coefficient estimates, and the complex reflection coefficient of the UUT is computed using the reflection coefficient estimates.

* * * * *